United States Patent [19]
Sheng et al.

[11] Patent Number: 5,545,580
[45] Date of Patent: Aug. 13, 1996

[54] MULTI-STATE READ-ONLY MEMORY USING MULTIPLE POLYSILICON SELECTIVE DEPOSITIONS

[75] Inventors: Yi-Chung Sheng, Taichung; Chen-Hui Chung, Hsinchu Hsien; Kuan-Cheng Su, Taipei, all of Taiwan

[73] Assignee: United Microelectronics Corporation, Hsinchu, Taiwan

[21] Appl. No.: 530,746

[22] Filed: Sep. 19, 1995

[51] Int. Cl.[6] .................................. H01L 21/8246
[52] U.S. Cl. .................. 437/48; 437/45; 437/154
[58] Field of Search ................. 437/45, 48, 153, 437/154, 931; 148/DIG. 157

[56] References Cited

U.S. PATENT DOCUMENTS

| | | | |
|---|---|---|---|
| 5,091,324 | 2/1992 | Hsu et al. | 437/45 |
| 5,278,078 | 1/1994 | Kanebako et al. | 437/48 |
| 5,372,961 | 12/1994 | Noda | 437/48 |

*Primary Examiner*—Chandra Chaudhari
*Attorney, Agent, or Firm*—Fish & Richardson, P.C.

[57] ABSTRACT

A multi-state read-only-memory device and a method for fabricating the same is suitable for forming on a semiconductor substrate. The read-only memory device is provided with bit lines and word lines which are mutually intersecting. In accordance with the present invention, multiple polysilicon selective deposition procedures are utilized to form a plurality of protrusion portions onto the word lines but with multiple thicknesses. Then, one implantation procedure is applied to program the device into multiple states at the same time without incurring misalignment problems that result in inaccuracy.

10 Claims, 10 Drawing Sheets

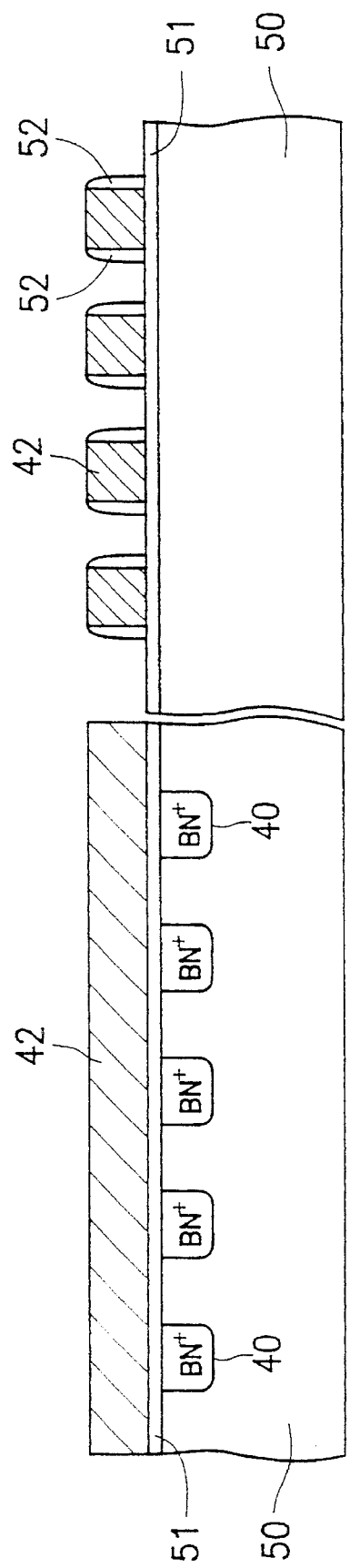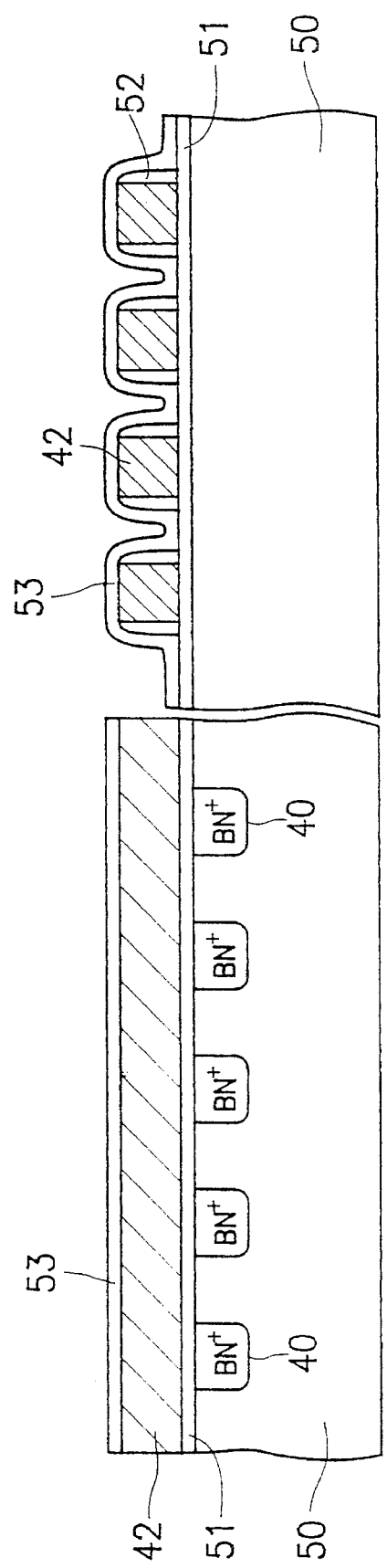

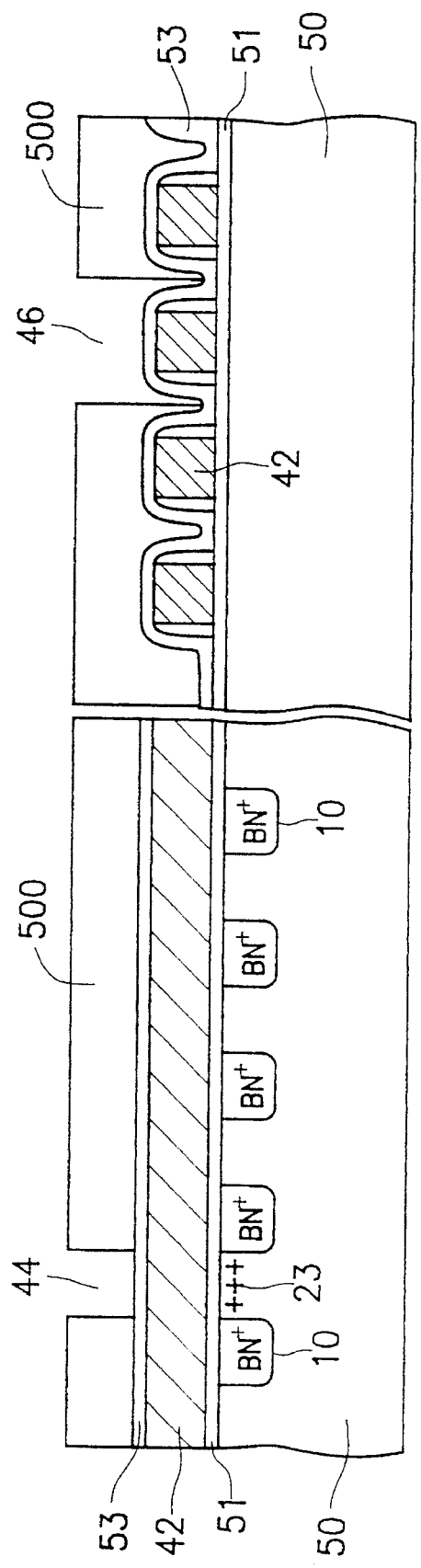
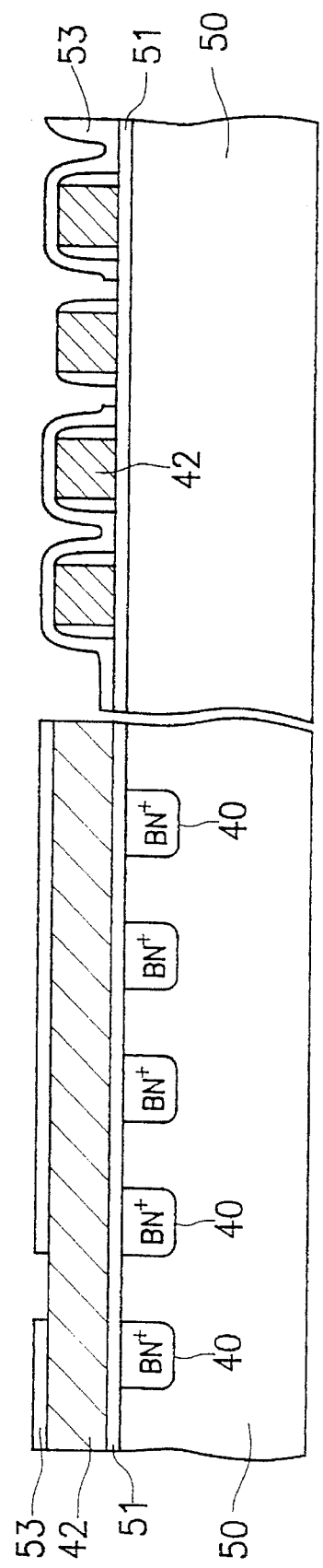
FIG. 5C
FIG. 5D

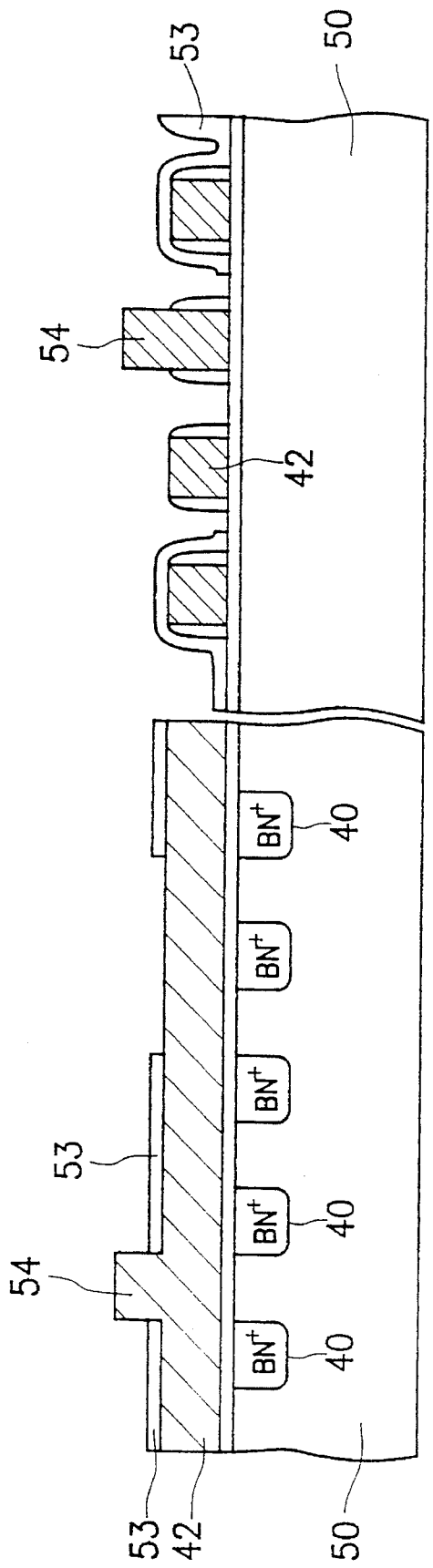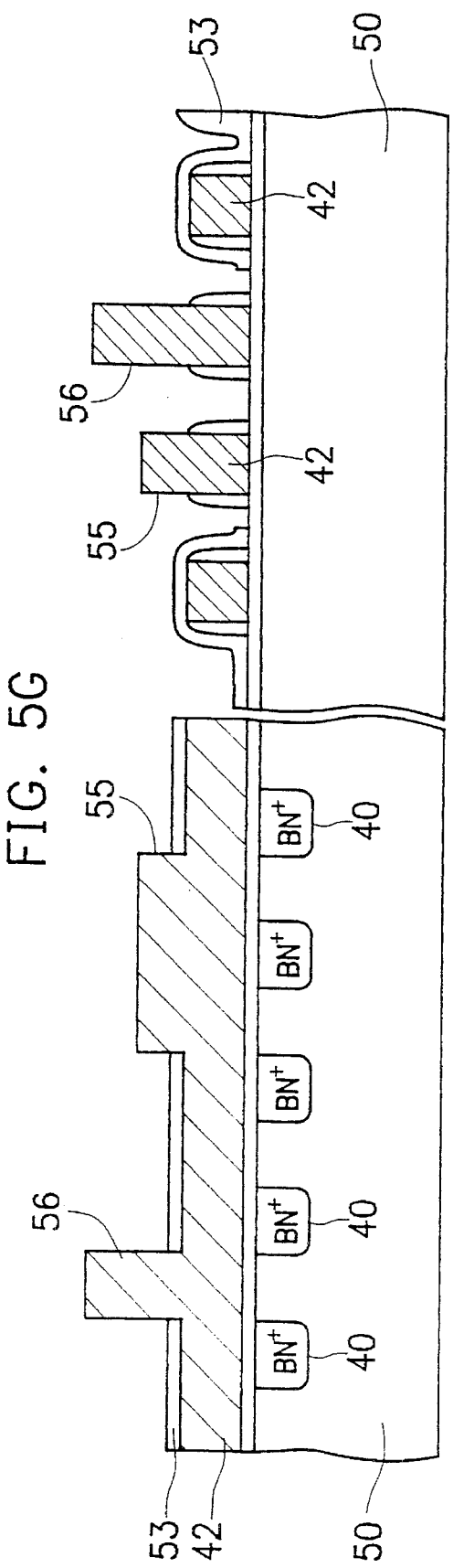
FIG. 5G
FIG. 5H

MULTI-STATE READ-ONLY MEMORY USING MULTIPLE POLYSILICON SELECTIVE DEPOSITIONS

BACKGROUND OF THE INVENTION

1. Field of the Invention

The present invention generally relates to semiconductor integrated circuits. More particularly, the present invention relates to a multi-state read-only memory device and a method for fabricating the same.

2. Description of the Related Art

Read-only memory (ROM) semiconductor integrated circuits (IC) are widely used as memory storage devices for digital electronic equipment, in particular, microprocessor-based computer systems, to store predetermined programs. In a conventional semiconductor ROM device, the channel region of a memory cell is selectively implanted with ions to adjust the threshold voltage thereof depending on whether the programmed memory cell is turned on or turned off to represent a logic "1" or a logic "0" in binary, respectively. Conventional ROM IC devices, therefore, store a single binary bit in each of their memory cells. Then, conventional digital circuitry in the ROM employs sense amplifiers to sense the content of an addressed memory cell for "reading." The sensed result with respect to each memory cell within the ROM is identified as one of two possible electrical potential states. In other words, the memory content of a ROM memory cell as read is either a logic "1" or a logic "0."

The trend in the semiconductor industry has been to increase the number of memory cells to increase the storage capacity of a semiconductor integrated circuit chip, while reducing the size of the semiconductor device itself. Enlarged memory capacity and reduced memory semiconductor die size represent increased functionality and reduced cost, both of which are desirable qualities from a merchandising point of view. Great effort has been expended in the art of semiconductor chip manufacture to reduce the dimensions of semiconductor devices in order to squeeze more memory cells into the same semiconductor die area. This approach, however, is limited by the resolution available according to the current state of fabrication techniques.

Increasing the number of states to which a memory cell can correspond is a practicable means for overcoming present limitations. Consequently, a tri-state read-only memory is set forth, whose threshold voltage is adjusted through ion implantation with different dosages to be, for example, 5 V, 2.5 V, or 0.8 V, to have logic states designated as "1","−", or "0", respectively. Referring to FIG. 1, the top view of a conventional tri-state read-only memory device is depicted. Numerals 10 represent bit lines formed in a substrate 20 (will be described below) spaced apart in parallel along a first direction 100. Numerals 12 represent word lines striding over the bit lines 10 mutually spaced in parallel along a second direction 102, having a dielectric layer 21 (to be described below) therebelow for isolating them from the substrate 20, respectively. Two adjacent bit lines 10 and a word line 12 striding over them constitute the source/drain regions and gate electrode of a MOS transistor, respectively. The channel region of the MOS transistor for carrier transport is formed between the source/drain regions. Numerals 14 and 16 mark the channel regions for storing a first state. Numeral 18 marks the channel region for storing a second state, and the remaining channel regions act as the regions for storing a third state.

Next referring to FIGS. 2A–2C, a conventional process flow for fabricating the tri-state ROM device, depicted in FIG. 1, is shown in cross-sectional views. The left hand side of each drawing illustrates the cross-sectional view taken along a line A–A' shown in FIG. 1. The right hand side of each drawing illustrates the cross-sectional view taken along a line B–B' shown in FIG. 1.

The conventional method is suited to fabricate a tri-state ROM device on a semiconductor substrate 20. First, as shown in FIG. 2A, a plurality of bit lines 10 are formed by implanting ions into the substrate 20. For example, the substrate 20 is a p-type silicon substrate while the implanted ions are N-type impurities, such as phosphorus or arsenic ions. Therefore, the bit lines 10 are designated as $BN^+$ buried in the substrate 20. Subsequently, thermal oxidation or deposition to the substrate 20 forms a silicon oxide layer acting as a dielectric layer 21, a polysilicon layer being thereafter formed on the dielectric layer 21, and then the polysilicon layer is etched to shape a plurality of word lines 12. As is known in this art, the polysilicon layer is doped with impurities so as to increase the conductivity thereof. After that, an oxide layer is deposited onto the overall surface, and then etched back to form spacers 22 on opposed sidewalls of the word lines 12.

Through a photolithography procedure, as shown in FIG. 2B, a first code mask layer 200 is formed over the substrate 20 to expose the channel regions for storing the first state, such as regions 14 and 16. By utilizing the first code mask layer 200 as an implantation mask, the impurities are implanted into the substrate 20 via the regions 14 and 16 to form first state region 23.

Whereby the first code mask layer 200 is thereafter removed and using another photolithography procedure, as shown in FIG. 2C, a second code mask layer 202 is formed over the substrate 20 for exposing the channel regions which stores the second state, such as the region 18. By utilizing the second code mask layer 202 as an implantation mask, the impurities are implanted into the substrate 20 via the region 18 to form a second state region 24. Because this ion implantation procedure makes use of a dosage higher than the aforementioned implantation procedure, the threshold voltages of these implanted channel regions 23 and 24 are adjusted into different states, such as 5 V and 2.5 V, respectively. The remaining channel regions are the regions for storing the third state, having a threshold voltage of about 0.8 V as exemplified.

The method for fabricating the tri-state ROM device utilizes multiple ion implantation procedures so as to program memory cells for storing one of the first, second, and third states. In such a way, the number of states which a memory cell can store is increased.

However, the conventional method is liable to incur misalignment problems resulting in inaccuracy while applying multiple photolithography procedures. For example, as shown in FIG. 3, numerals 30 are bit lines and numerals 32 represent word lines. Numerals 34 and 36 mark the channel regions for storing a first state. Numeral 38 marks the channel region for storing a second state, and the remaining channel regions act as the regions for storing a third state. In the drawing, the regions 36 and 38 are overlapped owing to misalignment problem revealing a overlapped region 39. Under this circumstance, the region 36 is affected by the high-dosage implantation procedure while implanting impurities via the region 38, resulting in a decreased current therein. Although the regions 36 and 34 belong to the same first state, the current flow therein varies.

3

For the forgoing reasons, there is a need for a method that can fabricate a multi-state ROM device without incurring misalignment problems.

SUMMARY OF THE INVENTION

Therefore, the present invention concerns a multi-state ROM device and a method for fabricating the same without incurring misalignment problems.

Furthermore, the present invention concerns a multi-state ROM device and a method for fabricating the same merely through one implantation procedure.

The method for fabricating a multi-state read-only memory device on a semiconductor substrate, comprises the following steps of: (a) defining a first direction and a second direction above the substrate; (b) forming a plurality of bit lines spaced apart in the substrate along the first direction; (c) forming a dielectric layer overlying the substrate; (d) forming a plurality of word lines on the dielectric layer along the second direction whereby channel regions are disposed between each pair of bit lines below the word lines striding thereover, wherein each word line above each corresponding channel region has a thickness selected from a series of thicknesses through a plurality of selective deposition steps; and (e) implanting impurities into the substrate for programming the channel regions into multiple states.

Moreover, the multi-state read-only memory device is fabricated on a semiconductor substrate wherein a first and a second directions are defined thereon, comprising: a plurality of bit lines disposed in the substrate spaced apart along the first direction; a dielectric layer formed to cover the substrate; a plurality of word lines spaced apart and formed on the dielectric layer thereby between each pair of the bit lines has a channel region below the word line, having a thickness selected from a series of thicknesses, striding thereover.

BRIEF DESCRIPTION OF THE DRAWINGS

These and other features, aspects, and advantages of the present invention will become better understood with regard to the following description, appended claims, and accompanying drawings where:

FIGS. 5A–5I shows the process flow, in cross-sectional views, for fabricating a multi-state read-only memory device of one preferred embodiment in accordance with the present invention.

DETAILED DESCRIPTION OF THE PREFERRED EMBODIMENT

Figure 1:
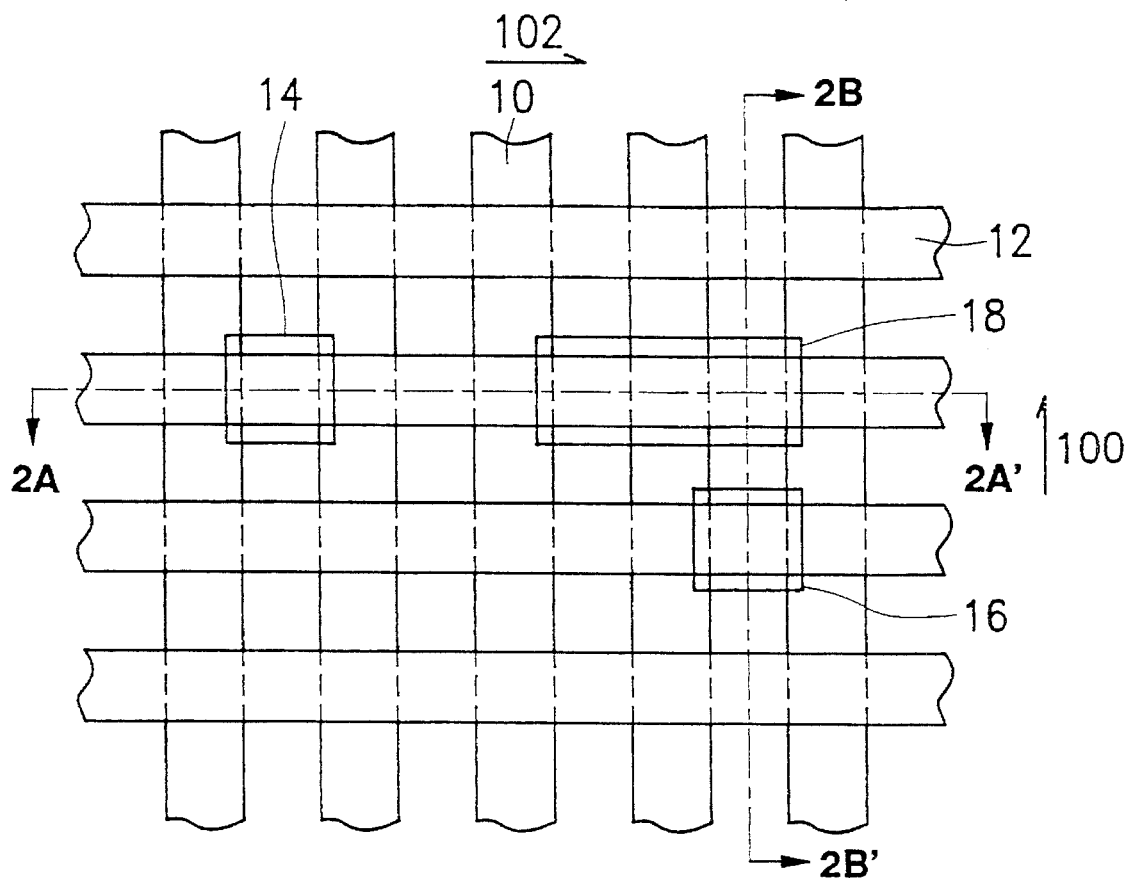
FIG. 1 shows a conventional tri-state read-only memory device in a top view.
Figure 2A:
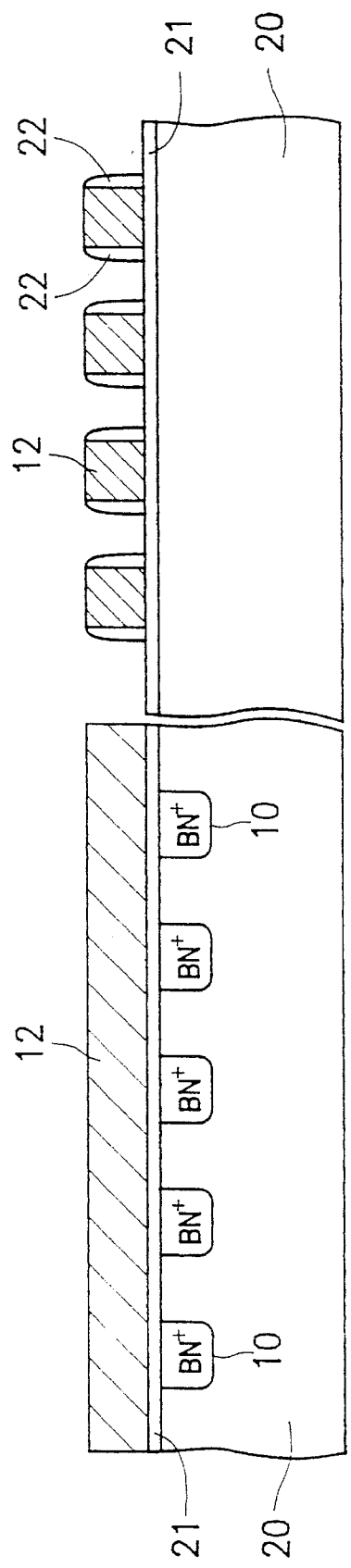
FIGS. 2A–2C shows the process flow, in cross-sectional views, for fabricating tri-state read-only memory device in accordance with the conventional method.
Figure 2B:
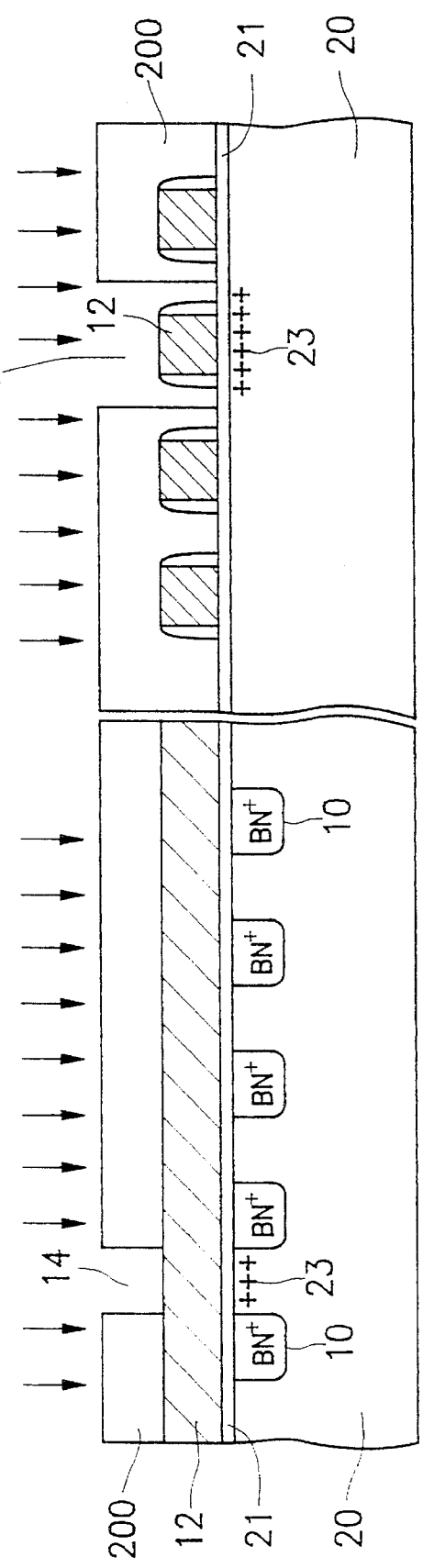
Figure 2C:
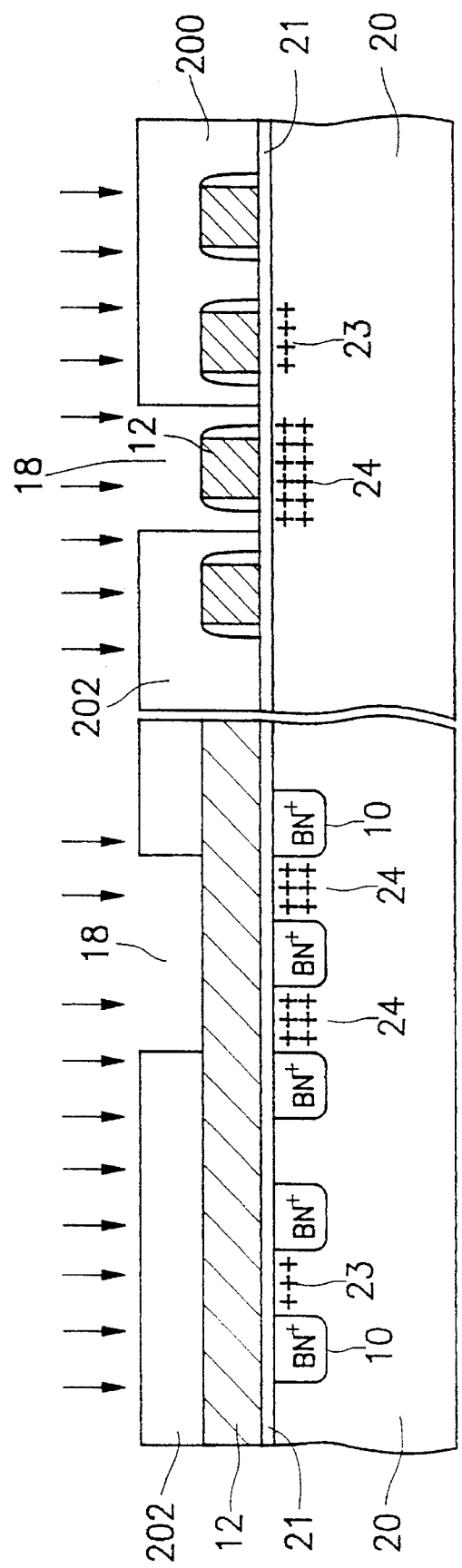
Figure 3:
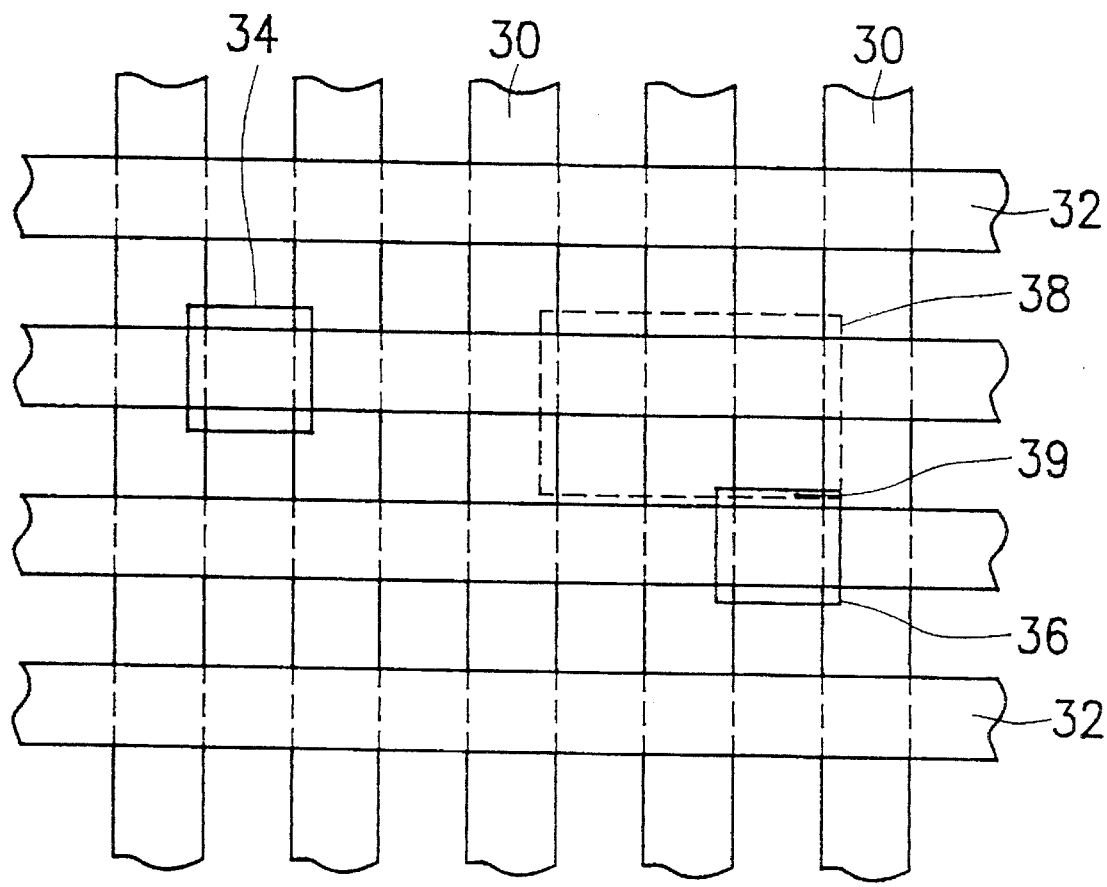
FIG. 3 shows a top view of a conventional tri-state read-only memory device that has incurred misalignment problems.
Figure 4:
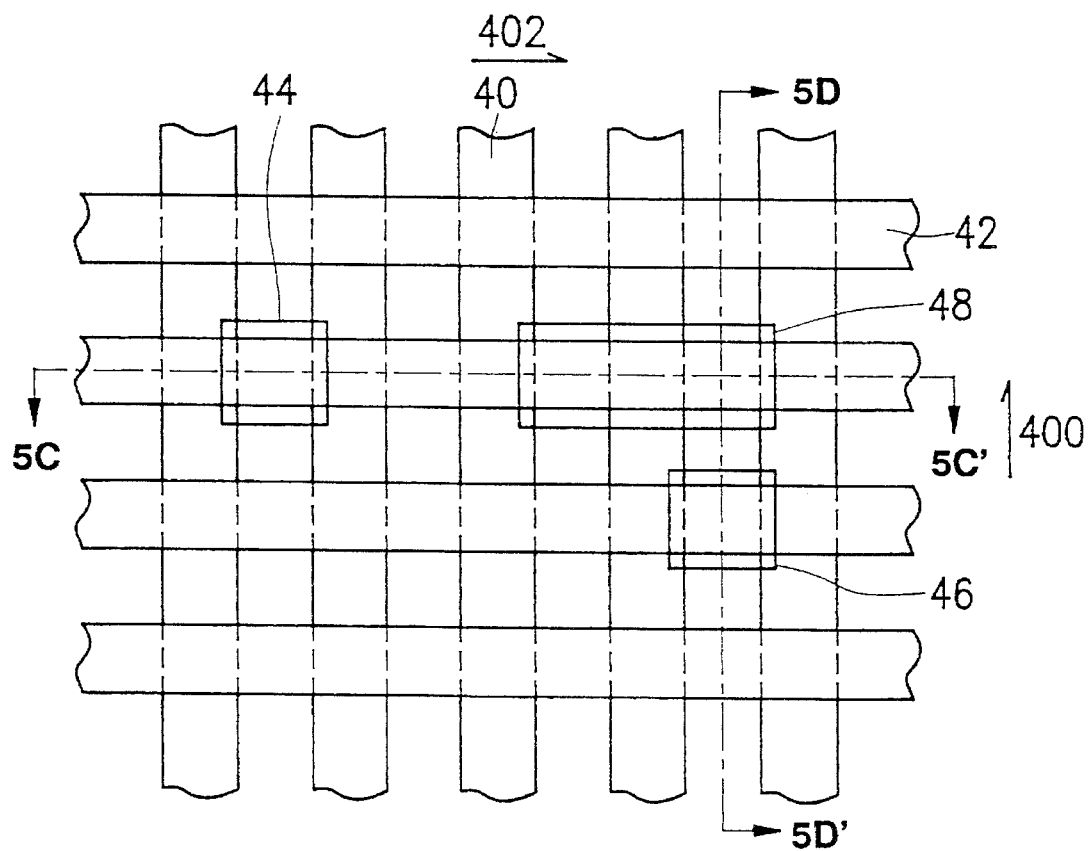
FIG. 4 shows a top view of a multi-state read-only memory device in accordance with the present invention.

Referring to FIG. 4, the top view of one preferred embodiment is depicted according to the present invention. The preferred embodiment exemplifies a tri-state ROM device. In the drawing, numerals 40 represent bit lines formed in a substrate 50 (will be described below) spaced apart in parallel along a first direction 400. Numerals 42 represent word lines striding over the bit lines 40 mutually spaced in parallel along a second direction 402, having a dielectric layer 51 (will be described in the following) therebelow for isolating them from the substrate 50, respectively. Two adjacent bit lines 40 and a word line 42 striding over them constitute the source/drain regions and gate electrode of a MOS transistor that is a memory cell, respectively. The channel region of the MOS transistor for carrier transport is formed between the source/drain regions. Numerals 44 and 46 mark the channel regions for storing a first state. Numeral 48 marks the channel region for storing a second state, and the remaining channel regions act as the regions for storing a third state.

Next referring to FIGS. 5A–5I, the process flow of the multi-state ROM device depicted in FIG. 4 is illustrated in cross-sectional views. The left hand side of each drawing illustrates the cross-sectional view taken along a line C–C' depicted in FIG. 4. The right hand side of each drawing illustrates the cross-sectional view taken along a line D–D' depicted in FIG. 4.

The preferred embodiment in accordance with the present invention is suitable for fabricating a multi-state ROM device on a semiconductor substrate 50. First, as shown in FIG. 5A, a plurality of bit lines 40 are formed by using a photolithography procedure and then implanting ions into the substrate 50. For example, the substrate 50 is a p-type silicon substrate while the implanted ions are N-type impurities, such as phosphorus or arsenic ions. Therefore, the bit lines 40 are designated as $BN^+$, meaning that they are buried in the substrate 50. Subsequently, thermal oxidation or deposition to the substrate 50 forms a silicon oxide layer acting as a dielectric layer 51, a polysilicon layer is then formed on the dielectric layer 51, and after which the polysilicon layer is etched to shape a plurality of word lines 42. Preferably, the polysilicon layer is doped with impurities so as to increase the conductivity therein. After that, an oxide layer is deposited onto the overall surface, and then etched back to form spacers 52 on opposed sidewalls of the word lines 42, respectively.

Next shown in FIG. 5B, an oxide layer 53 is formed to cover the substrate 50, including the spacers 52 and word lines 42. For example, the oxide layer 53 can be deposited by an HTO (high temperature oxidation) method. Then, a first mask layer 500, e.g. a photoresist layer, is formed on the oxide layer 53 by a photolithography procedure. The first mask layer 500 defines channel regions for storing the first state, such as regions 44 and 46, to expose a portion of the oxide layer 53 as shown in FIG. 5C. By sequentially utilizing the first mask layer 500 as masking, the oxide layer 53 is etched and patterned to expose a portion of the word lines 42. After that, the first mask layer 500 is removed as shown in FIG. 5D.

Figure 5E:
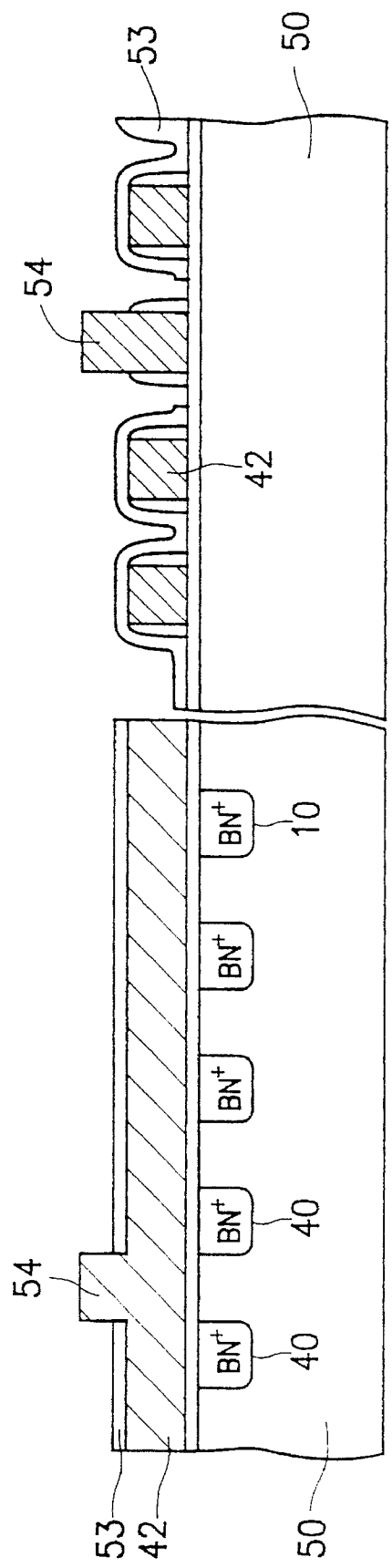

Referring to FIG. 5E, polysilicon, ranging from about 500Å to about 800Å, is selectively deposited on the exposed portion of the word lines 42 to form first protrusion portions 54. The selectively deposited method has been disclosed in J. R. Pfiester et al., "A SELF-ALIGNED LDD/CHANNEL IMPLANTED ITLDD PROCESS WITH SELECTIVELY-DEPOSITED POLY GATES FOR CMOS VLSI," IEDM Tech Digest, 1989, pp. 769–772. The polysilicon deposition rate is about 170Å per minute at a temperature of about 850° C.

Figure 5F:
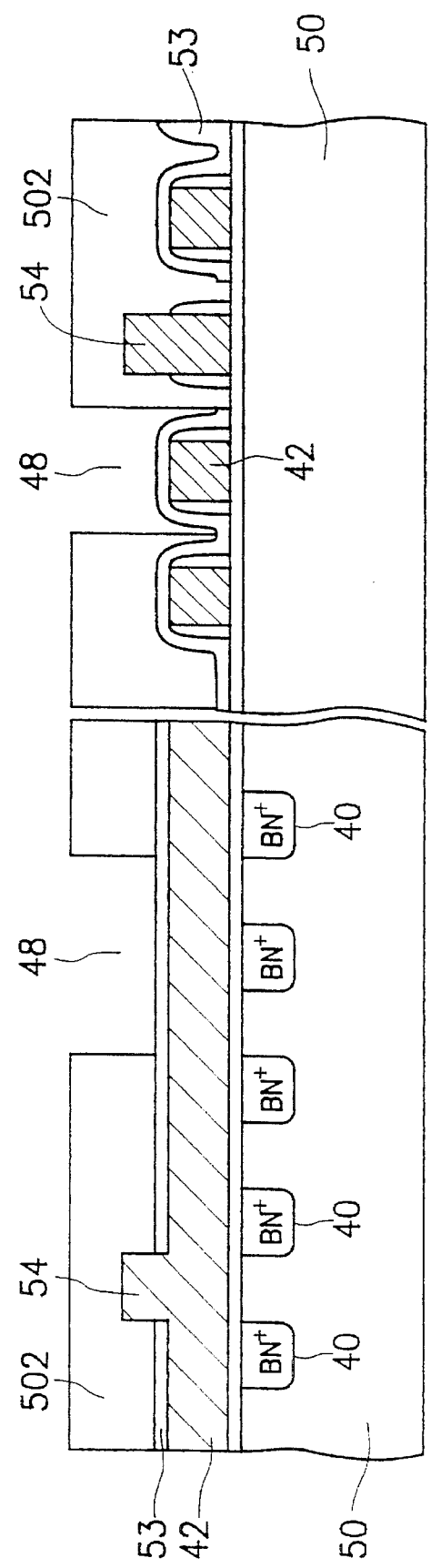
Figure 51:
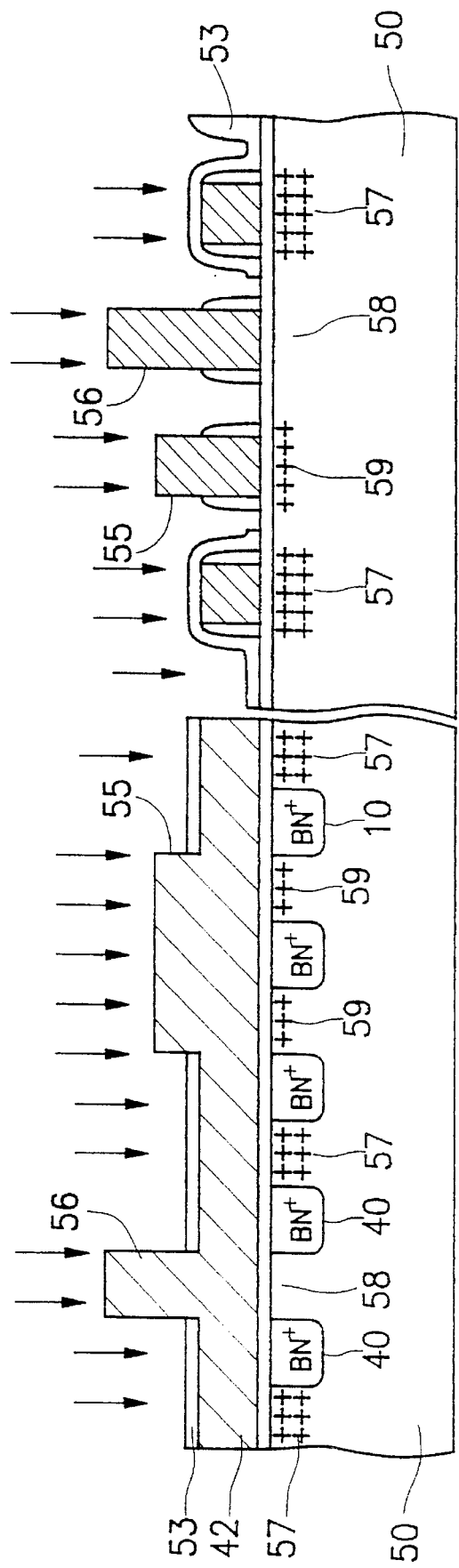

Then, as shown in FIG. 5F, a second mask layer 502, e.g. a photoresist layer, is formed over the substrate 50, through another photolithography procedure, so as to define the channel regions for storing the second state, such as the region 48 to expose other portions of the oxide layer 53. Furthermore, by utilizing the-second mask layer 502 as masking, the oxide layer 53 is etched and patterned to expose other portions of the word lines 42 according to the patterns of the second. mask layer 502. Afterwards, the second mask layer 502 is removed to obtain the structure shown in FIG. 5G.

For the same reason, polysilicon, ranging from about 500Å to about 800Å, is selectively deposited onto the exposed word lines 42, including the first protrusion portion 54 to form second and third protrusion portions 55 and 56, respectively. Owing to the formation of the third protrusion portion 56 through selectively carrying out the deposition process twice, the third protrusion portion 56 has a thickness larger than the second protrusion portion 55, as depicted in FIG. 5H.

Finally referring to FIG. 5I, the word lines provided with the second and third protrusion portions 55 and 56 have three kinds of thicknesses in accordance with the corresponding channel regions. Merely one implantation procedure is required to program the multi-state ROM device at the same time. For example, the implantation procedure can employ boron-containing impurities, such as $B^+$ or $BF_2^+$, performed with an energy of about 130–150 KeV at a dosage of about 1E14–1E15 $cm^{-2}$. Through the word lines provided with three kind of thicknesses as masking, first, second, and third state regions 58,59,57 are formed in the substrate 50 at the same time. The first state region 58 is shielded by the third protrusion portion 56, which can resist the impurities implanted into the substrate 50, therefore it represents an ON state having a threshold voltage of about 0.8 V. The second state region 59 utilizes the second protrusion portion 55 as masking, therefore impurities are partially implanted therein, producing a middle state having a threshold voltage of about 2.5 V. Moreover, because the third state region 57 merely has word lines of between 1500 and 2000Å in thickness, it has a greater amount of implanted impurities than that implanted into the second state region 59, therefore it constitutes an OFF state having a threshold voltage of about 5 V.

In conclusion, the present invention utilizes multiple polysilicon selective deposition procedure to form a plurality of word lines with varying thicknesses. Then, one implantation procedure is applied to program all multiple states at the same time without suffering misalignment problems that result in inaccuracy.

Although the present invention has been described in considerable detail with reference to certain preferred embodiments thereof, other versions are possible. For example, two states or more than three states are also attainable. Therefore, the spirit and scope of the appended claims should not be limited to the description of the preferred embodiments contained herein.

What is claimed is:

1. A method for fabricating a multi-state read-only memory device on a semiconductor substrate, comprising:

(a) defining a first direction and a second direction above said substrate;

(b) forming a plurality of bit lines spaced apart in said substrate along said first direction;

(c) forming a dielectric layer overlying said substrate;

(d) forming a plurality of word lines on said dielectric layer along said second direction whereby channel regions are disposed between each pair of bit lines below said word lines striding thereover, wherein each said word line above each said corresponding channel region has a thickness selected from a series of thicknesses through a plurality of selective deposition steps; and (e) implanting impurities into said substrate for programming said channel regions into multiple states.

2. The method as in claim 1, wherein the step (d) comprises:

forming a plurality of polysilicon lines spaced apart on said dielectric layer along said second direction;

forming a silicon oxide layer covering said polysilicon lines;

subsequently and repeatedly the following steps, comprising:

forming a mask layer on said silicon oxide layer;

etching said silicon oxide layer by utilizing said mask layer as masking;

removing said mask layer;

selectively depositing polysilicon on portions of said word lines not covered by said silicon oxide layer;

until said word lines have thicknesses that correspond to said series of thicknesses.

3. The method as in claim 2, wherein each said polysilicon line has a thickness ranging from about 1500Å to about 2000Å.

4. The method as in claim 2, wherein the selectively deposited polysilicon has a thickness ranging from about 500Å to about 800Å.

5. The method as in claim 2, wherein said mask layer is a photoresist layer formed by photolithography.

6. The method as in claim 1, wherein said series of thicknesses have an increment ranging from about 500Å to about 800Å.

7. The method as in claim 1, wherein the step (e) is performed at an energy of about 130–150 KeV with a dosage of about 1E14–1E15 $cm^{-2}$.

8. The method as in claim 1, wherein the step (b) is achieved by a photolithography procedure.

9. The method as in claim 1, wherein said dielectric layer is made of silicon oxide.

10. The method as in claim 1, wherein said first direction is approximately orthogonal to said second direction.

* * * * *